(12) United States Patent
Galstyan et al.

(10) Patent No.: US 11,823,874 B2
(45) Date of Patent: Nov. 21, 2023

(54) SUBSTRATE TREATING APPARATUS AND METHOD FOR CONTROLLING TEMPERATURE OF FERRITE CORE

(71) Applicant: SEMES CO., LTD., Chungcheongnam-do (KR)

(72) Inventors: Ogsen Galstyan, Cheonan-si (KR); Junpyo Lee, Pohang-si (KR); Goon Ho Park, Seoul (KR); Hyun-Jin Kim, Daegu (KR); Young-Bin Kim, Hwaseong-si (KR); Jong-Hwan An, Yongin-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 281 days.

(21) Appl. No.: 17/323,250

(22) Filed: May 18, 2021

(65) Prior Publication Data
US 2021/0366695 A1 Nov. 25, 2021

(30) Foreign Application Priority Data
May 19, 2020 (KR) .......................... 10-2020-0059469

(51) Int. Cl.
*H01J 37/32* (2006.01)
(52) U.S. Cl.
CPC .... *H01J 37/32724* (2013.01); *H01J 37/3244* (2013.01); *H01J 37/3266* (2013.01); *H01J 37/32174* (2013.01)
(58) Field of Classification Search
CPC .............. H01J 37/3244; H01J 37/3266; H01J 37/32091; H01J 37/32174; H01J 37/32724; H01J 37/32798
See application file for complete search history.

(56) References Cited

U.S. PATENT DOCUMENTS 10,978,274 B2 * 4/2021 Kubota ............ H01J 37/32183
2004/0194709 A1 10/2004 Yamagishi et al.
(Continued)

FOREIGN PATENT DOCUMENTS

| CN | 101437354 A | 5/2009 |
| CN | 101527262 A | 9/2009 |

(Continued)

OTHER PUBLICATIONS

Japan Patent Office, Office action dated Nov. 15, 2022.
China Patent Office, Office action dated Jul. 28, 2023.

*Primary Examiner* — Tung X Le
(74) *Attorney, Agent, or Firm* — Li & Cai Intellectual Property (USA) Office

(57) ABSTRACT

Disclosed is a substrate treating apparatus, which includes a chamber having a space for treating a substrate in an interior thereof, a substrate support assembly including a support plate situated in the chamber and which supports the substrate, a gas supply unit which supplies a gas into the interior of the chamber, a plasma generating unit which excites the gas in in the interior of the chamber into a plasma state, and a substrate temperature control unit which controls a temperature of the substrate, and the substrate temperature control unit includes a plurality of heaters installed in different areas of the support plate, a power supply part which supplies electric power to the plurality of heaters, a ferrite core which interrupts a low-frequency signal introduced to the power supply part, and a plurality of air cores which interrupts a high-frequency signal introduced into the power supply part.

16 Claims, 4 Drawing Sheets

(56) References Cited

U.S. PATENT DOCUMENTS

| | | | |
|---|---|---|---|
| 2007/0284344 A1* | 12/2007 | Todorov | H05H 1/46 |
| | | | 219/121.54 |
| 2008/0197780 A1* | 8/2008 | Yamazawa | H01L 21/67069 |
| | | | 315/111.21 |
| 2017/0318627 A1 | 11/2017 | Won et al. | |
| 2018/0374672 A1 | 12/2018 | Hayashi et al. | |
| 2019/0109576 A1* | 4/2019 | Long | G01S 13/00 |
| 2020/0234924 A1* | 7/2020 | Yokogawa | H01J 37/321 |

FOREIGN PATENT DOCUMENTS

| | | | |
|---|---|---|---|
| CN | 103854947 A | 6/2014 | |
| CN | 108878247 A | 11/2018 | |
| CN | 109545641 A | 3/2019 | |
| CN | 109727839 A | 5/2019 | |
| CN | 111146134 A | 5/2020 | |
| JP | 1993-021525 U | 3/1993 | |
| JP | 2003004559 A | 1/2003 | |
| JP | 2013-543252 A | 11/2013 | |
| JP | 2014-229565 A | 12/2014 | |
| JP | 2016-001647 A | 1/2016 | |
| JP | 2020072213 A | 5/2020 | |
| JP | 2020-536462 A | 12/2020 | |
| KR | 1020070061988 A | 6/2007 | |
| KR | 1020170123830 A | 11/2017 | |
| KR | 1020200053121 A | 5/2020 | |

* cited by examiner

SUBSTRATE TREATING APPARATUS AND METHOD FOR CONTROLLING TEMPERATURE OF FERRITE CORE

CROSS-REFERENCE TO RELATED APPLICATIONS

A claim for priority under 35 U.S.C. § 119 is made to Korean Patent Application No. 10-2020-0059469 filed on May 19, 2020, in the Korean Intellectual Property Office, the entire contents of which are hereby incorporated by reference.

BACKGROUND

Embodiments of the inventive concept described herein relate to a substrate treating apparatus and a method for controlling a temperature of a ferrite core, and more particularly to a substrate treating apparatus that controls a temperature of a substrate according to respective areas, and a method for controlling a temperature of a ferrite core.

In a semiconductor manufacturing process, a substrate temperature controlling apparatus for controlling a temperature of a substrate is necessary. An existing substrate temperature controlling apparatus controls a plurality of heating units for adjusting the temperatures of respective areas of the substrate with a plurality of control units corresponding to the respective heating units. However, a substrate having a multi-zone that has been spotlighted recently requires 100 or more heating units, and when a control unit corresponding to the heating units is provided, a facility that is 30 or more times as large as an existing facility is required. The increase in the volume of the facility may go against a recent tendency of reducing the volume of facilities.

Furthermore, in the case of a substrate having a multi-zone, because the number of controllers or filters for controlling heaters for heating the substrate increases as the number of the heaters increases, a process environment may be changed due to the influence of the controller or the filters.

SUMMARY

Embodiments of the inventive concept provide a substrate treating apparatus that may reduce an influence of the apparatus on a process, and a method for controlling a temperature of a ferrite core.

The problems that are to be solved by the inventive concept are not limited to the above-mentioned problems, and the unmentioned problems will be clearly understood by those skilled in the art to which the inventive concept pertains from the specification and the accompanying drawings.

According to an embodiment, a substrate treating apparatus includes a chamber having a space for treating a substrate in an interior thereof, a substrate support assembly including a support plate situated in the chamber and which supports the substrate, a gas supply unit which supplies a gas into the interior of the chamber, a plasma generating unit which excites the gas in in the interior of the chamber into a plasma state, and a substrate temperature control unit which controls a temperature of the substrate, and the substrate temperature control unit includes a plurality of heaters installed in different areas of the support plate, a power supply part which supplies electric power to the plurality of heaters, a ferrite core which interrupts a low-frequency signal introduced to the power supply part, and a plurality of air cores which interrupt a high-frequency signal introduced into the power supply part.

The ferrite core may be provided between the plurality of air cores and the power supply part and a length of the ferrite core may be larger than those of the plurality of air cores.

The ferrite core may comprise a coil having an inductance of 100 µH to 150 µH.

The substrate temperature control unit may further include a ferrite core temperature measuring part which measures a temperature of the ferrite core.

The substrate temperature control unit may further include a ferrite core cooling part which cools the ferrite core, and a ferrite core temperature control part which controls the ferrite core cooling part according to the temperature of the ferrite core.

The ferrite core cooling part may include a plurality of cooling fans installed around the ferrite core.

The ferrite core temperature control part may control the ferrite core cooling part such that the temperature of the ferrite core is maintained in a range of 50 to 100 degrees Celsius.

According to another embodiment, a substrate treating apparatus includes a chamber having a space for treating a substrate in an interior thereof, a substrate support assembly including a support plate situated in the chamber and which supports the substrate, a gas supply unit which supplies a gas into the interior of the chamber, a plasma generating unit which excites the gas in in the interior of the chamber into a plasma state, and a substrate temperature control unit which controls a temperature of the substrate, the substrate temperature control unit includes a plurality of heaters installed in different areas of the support plate, a plurality of power supply parts which supply electric power to the plurality of heaters, respectively, and a filter circuit connected between the plurality of heaters and the plurality of power supply parts, and the filter circuit may include a first filter which performs filtering by using a plurality of air cores connected to the plurality of heaters, and a second filter connected between the first filter and the plurality of power supply parts and which performs filtering by using one ferrite core.

According to another embodiment, a method for controlling the temperature of the ferrite core by using the substrate treating apparatus includes cooling the ferrite core when the temperature of the ferrite core is higher than a preset value.

The preset value may be 100 degrees Celsius.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The above and other advantages and features of the inventive concept, and methods of the inventive concept for achieving them will become apparent from the following description of the following embodiments which are given in conjunction with the accompanying drawings and will be described below in detail. However, the inventive concept is not limited by the embodiments disclosed herein but will be realized in various different forms, and the embodiments are provided only to make the disclosure of the inventive concept complete and fully inform the scope of the inventive concept to an ordinary person in the art, to which the inventive concept pertains, and the inventive concept will be defined by the scope of the claims.

Although not defined, all the terms (including technical or scientific terms) used herein may have the same meanings that are generally accepted by the common technologies in the field to which the inventive concept pertains. The terms defined by the general dictionaries may be construed to have the same meanings as those meant in the related technologies and/or the disclosure of the application, and will neither become conceptual nor be construed to be excessively formal even though not clearly defined herein.

The terms used herein are provided to describe the embodiments but not to limit the inventive concept. In the specification, the singular forms include plural forms unless particularly mentioned. The expressions 'include' and/or its various conjugated forms, such as 'including', which are used in the specification do not exclude existence or addition of one or more compositions, substances, elements, steps, operations, and/or devices. In the specification, the term 'and/or' represents enumerated configurations or various combinations thereof.

Figure 1:
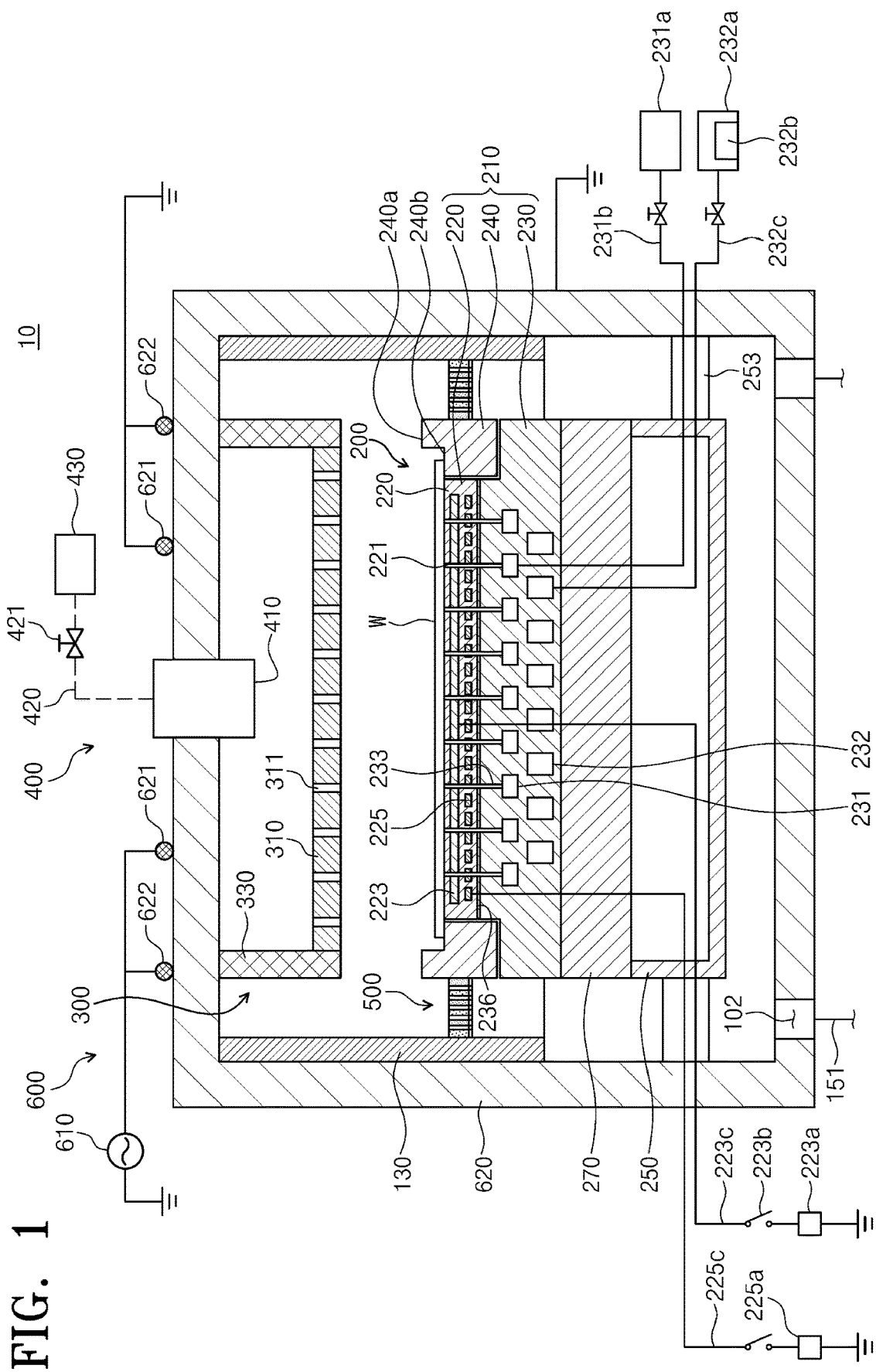
FIG. 1 is an exemplary view illustrating a substrate treating apparatus according to an embodiment of the inventive concept.

FIG. 1 is an exemplary view illustrating a substrate treating apparatus according to an embodiment of the inventive concept.

Referring to FIG. 1, a substrate treating apparatus 10 treats a substrate W by using plasma. For example, the substrate treating apparatus 10 may perform an etching process on the substrate W. The substrate treating apparatus 10 may include a chamber 620, a substrate support assembly 200, a shower head 300, a gas supply unit 400, a baffle unit 500, and a plasma generating unit 600.

The chamber 620 may provide a treatment space in which a substrate treating process is performed in the interior thereof. The chamber 620 may have a treatment space in the interior thereof, and may have a closed shape. The chamber 620 may be formed of a metallic material. The chamber 620 may be formed of aluminum. The chamber 620 may be grounded. An exhaust hole 102 may be formed on a bottom surface of the chamber 620. The exhaust hole 102 may be connected to an exhaust line 151. The reaction side-products generated in the process and gases left in the interior space of the chamber may be discharged to the outside through the exhaust line 151. The pressure of the interior of the chamber 620 may be reduced to a specific pressure through an exhaustion process.

According to an embodiment, a liner 130 may be provided in the interior of the chamber 620. The liner 130 may have a cylindrical shape, the upper surface and the lower surface of which are opened. The liner 130 may be configured to contact an inner surface of the chamber 620. The liner 130 may prevent an inner wall of the chamber 620 from being damaged due to arc discharging by protecting the inner wall of the chamber 620. Furthermore, the liner 130 may prevent the impurities generated during the substrate treating process from being deposited on the inner wall of the chamber 620. Optionally, the liner 130 may not be provided.

The substrate support assembly 200 may be situated in the interior of the chamber 620. The substrate support assembly 200 may support the substrate W. The substrate support assembly 200 may include an electrostatic chuck 210 that suctions the substrate W by using an electrostatic force. Unlike this, the substrate support assembly 200 may support the substrate W in various methods such as mechanical clamping. Hereinafter, the substrate support assembly 200 including the electrostatic chuck 210 will be described.

The substrate support assembly 200 may include the electrostatic chuck 210, a lower cover 250, and a plate 270. The substrate support assembly 200 may be situated in the interior of the chamber 620 to be spaced upwards apart from the bottom surface of the chamber 620.

The electrostatic chuck 210 may include a dielectric plate 220, a body 230, and a focus ring 240. The electrostatic chuck 210 may support the substrate W. The dielectric plate 220 may be situated at an upper end of the electrostatic chuck 210. The dielectric plate 220 may be formed of a dielectric substance and may have a disk shape. The substrate W may be positioned on an upper surface of the dielectric plate 220. The upper surface of the dielectric plate 220 may have a radius that is smaller than that of the substrate W. Accordingly, a peripheral area of the substrate W may be situated on an outer side of the dielectric plate 220.

A first electrode 223, a heating unit 225, and a first supply passage 221 may be included in the interior of the dielectric plate 220. The first supply passage 221 may extend from an upper surface to a bottom surface of the dielectric plate 220. A plurality of first supply passages 221 are formed to be spaced apart from each other to be provided as passages through which a heat transfer medium is supplied to the bottom surface of the substrate W.

The first electrode 223 may be electrically connected to a first power supply 223a. The first power supply 223a may include a DC power supply. A switch 223b may be installed between the first electrode 223 and the first power supply 223a. The first electrode 223 may be electrically connected to the first power supply 223a by switching on and off the switch 223b. If the switch 223b is switched on, a DC current may be applied to the first electrode 223. An electrostatic force may be applied between the first electrode 223 and the substrate W by a current applied to the first electrode 223, and the substrate W may be suctioned to the dielectric plate 220 by an electrostatic force.

The heating unit 225 may be situated under the first electrode 223. The heating unit 225 may be electrically connected to a second power supply 225a. The heating unit 225 may generate heat by a resistance due to a current applied to the second power supply 225a. The generated heat may be transferred to the substrate W through the dielectric plate 220. The substrate W may be maintained at a specific temperature by the heat generated by the heating unit 225. The heating unit 225 may include a spiral coil. The heating unit 225 may include a plurality of heaters 225.

The body 230 may be situated under the dielectric plate 220. A bottom surface of the dielectric plate 220 and an upper surface of the body 230 may be bonded to each other by an adhesive 236. The body 230 may be formed of aluminum. An upper surface of the body 230 may be situated such that a central area thereof is higher than a peripheral area thereof. The central area of the upper surface of the body 230 may have an area corresponding to a bottom surface of the dielectric plate 220, and may be bonded to the bottom surface of the dielectric plate 220. The body 230 may have first circulation passages 231, second circulation passages 232, and second supply passages 233 in the interior thereof.

The first circulation passages 231 may be provided as passages through which a heat transfer medium circulates. The first circulation passages 231 may be formed in the interior of the body 230 to have a spiral shape. Further, the first circulation passages 231 may be disposed such that passages having ring shapes of different radii have the same center. The first circulation passages 231 may communicate with each other. The first circulation passages 231 may be formed at the same height.

The second circulation passages 232 may be provided as passages through which a cooling fluid circulates. The second circulation passages 232 may be formed in the interior of the body 230 to have a spiral shape. Further, the second circulation passages 232 may be disposed such that passages having ring shapes of different radii have the same center. The second circulation passages 232 may communicate with each other. The second circulation passages 232 may have a sectional area that is larger than that of the first circulation passage 231. The second circulation passages 232 may be formed at the same height. The second circulation passages 232 may be located under the first circulation passages 231.

The second supply passages 233 may extend upwards from the first circulation passages 231, and may be provided on an upper surface of the body 230. The number of the second supply passages 233 corresponds to the number of the first supply passages 221 and may connect the first circulation passages 231 and the first supply passages 221.

The first circulation passages 231 may be connected to a heat transfer medium storage 231a through heat transfer medium supply lines 231b. A heat transfer medium may be stored in the heat transfer medium storage 231a. The heat transfer medium may include an inert gas. According to an embodiment, the heat transfer medium may include a helium (He) gas. The helium gas may be supplied to the first circulation passages 231 through the supply lines 231b, and may be supplied to the bottom surface of the substrate W after sequentially passing through the second supply passages 233 and the first supply passages 221. The helium gas may function as a medium by which the heat transferred from plasma to the substrate W is transferred to the electrostatic chuck 210.

The second circulation passages 232 may be connected to the cooling fluid storage 232a through cooling fluid supply lines 232c. The cooling fluid storage 232a may store a cooling fluid. A cooler 232b may be provided in the cooling fluid storage 232a. The cooler 232b may cool the cooling fluid to a specific temperature. Unlike this, the cooler 232b may be installed on the cooling fluid supply line 232c. The cooling fluid supplied to the second circulation passages 232 through the cooling fluid supply lines 232c may cool the body 230 while circulating along the second circulation passages 232. The body 230 may cool the dielectric plate 220 and the substrate W together while being cooled to maintain the substrate W at a specific temperature.

The body 230 may include a metal plate. According to an embodiment, the whole body 230 may be formed of a metal plate.

The focus ring 240 may be disposed at a peripheral area of the electrostatic chuck 210. The focus ring 240 may have a ring shape and may be disposed along a circumference of the dielectric plate 220. An upper surface of the focus ring 240 may be situated such that an outer side 240a thereof is higher than an inner side 240b thereof. The inner side 240b of the upper surface of the focus ring 240 may be located at the same height as that of the upper surface of the dielectric plate 220. The inner side 240b of the upper surface of the focus ring 240 may support a peripheral area of the substrate W located on an outside of the dielectric plate 220. The outer side 240a of the focus ring 240 may be provided to surround a peripheral area of the substrate W. The focus ring 240 may control an electromagnetic field such that densities of plasma are uniformly distributed in the whole area of the substrate W. Accordingly, plasma is uniformly formed over the whole area of the substrate W such that the areas of the substrate W may be uniformly etched.

The lower cover 250 may be situated at a lower end of the substrate support assembly 200. The lower cover 250 may be spaced upwards apart from the bottom surface of the chamber 620. An open-topped space may be formed in the interior of the lower cover 250. The outer radius of the lower cover 250 may have the same as the outer radius of the body 230. A lift pin module (not illustrated) that moves the transferred substrate W from a transfer member on the outside to the electrostatic chuck 210 may be situated in the interior space 255 of the lower cover 250. The lift pin module (not illustrated) may be spaced apart from the lower cover 250 by a specific interval. A bottom surface of the lower cover 250 may be formed of a metallic material. The interior space 255 of the lower cover 250 may be provided with air. Because the dielectric constant of air is lower than that of an insulator, the air may reduce an electromagnetic field in the interior of the substrate support assembly 200.

The lower cover 250 may have a connecting member 253. The connecting member 253 may connect an outer surface of the lower cover 250 and an inner wall of the chamber 620. A plurality of connecting members 253 may be provided on an outer surface of the lower cover 250 at a specific interval. The connecting member 253 may support the substrate support assembly 200 in the interior of the chamber 620. Further, the lower cover 250 may be connected to the inner wall of the chamber 620 to be electrically grounded. A first power line 223c connected to the first power supply 223a, a second power line 225c connected to the second power supply 225a, a heat transfer medium supply line 231b connected to the heat transfer medium storage 231a, and a cooling fluid supply line 232c connected to the cooling fluid storage 232a may extend into the lower cover 250 through the interior space 255 of the connecting member 253.

The plate 270 may be situated between the electrostatic chuck 210 and the lower cover 250. The plate 270 may cover an upper surface of the lower cover 250. The plate 270 may have a sectional area corresponding to the body 230. The plate 270 may include an insulator. According to an embodiment, one or more plates 270 may be provided. The plate 270 may function to increase an electrical distance between the body 230 and the lower cover 250.

The shower head 300 may be situated above the substrate support assembly 200 in the interior of the chamber 620. The shower head 300 may be situated to face the substrate support assembly 200.

The shower head 300 may include a gas dispersing plate 310 and a support 330. The gas dispersing plate 310 may be spaced downwards apart from an upper surface of the chamber 620. A space may be formed between the gas dispersing plate 310 and the upper surface of the chamber 620. The gas dispersing plate 310 may have a plate shape having a specific thickness. The bottom surface of the gas dispersing plate 310 may be anodized to prevent generation of an arc by plasma. The gas dispersing plate 310 may have the same shape and cross-section as those of the substrate support assembly 200. The gas dispersing plate 310 may include a plurality of ejection holes 311. The ejection holes 311 may vertically pass through the upper surface and the lower surface of the gas dispersing plate 310. The gas dispersing plate 310 may include a metallic material.

The support 330 may support a side of the gas dispersing plate 310. An upper end of the support 330 may be connected to the upper surface of the chamber 620, and a lower end of the support 330 may be connected to a side of the gas dispersing plate 310. The support 330 may include a non-metallic plate.

The substrate treating apparatus 10 may include a dielectric substance (or a cover) that constitutes the upper surface of the chamber 620 instead of the shower head 300. The dielectric substance may have a plate shape, and may close the interior space of the chamber 620. In this case, a gas supply nozzle 410 may be installed at a central portion of the dielectric substance.

The gas supply unit 400 may supply a process gas into the interior of the chamber 620. The gas supply unit 400 may include the gas supply nozzle 410, a gas supply line 420, and a gas storage unit 430. The gas supply nozzle 410 may be installed at a central portion of the upper surface of the chamber 620. An ejection hole may be formed on the bottom surface of the gas supply nozzle 410. A process gas may be supplied into the interior of the chamber 620 through the ejection hole. The gas supply line 420 may connect the gas supply nozzle 410 and the gas storage unit 430. The gas supply line 420 may supply the process gas stored in the gas storage unit 430 to the gas supply nozzle 410. A valve 421 may be installed in the gas supply line 420. The valve 4212 may open and close the gas supply line 420, and may adjust a flow rate of the process gas supplied through the gas supply line 420.

The baffle unit 500 may be located between the inner wall of the chamber 620 and the substrate support assembly 200. A baffle 510 may have an annular ring shape. The baffle 510 may have a plurality of through-holes 511. The process gas provided into the chamber 620 may pass through through-holes 511 of the baffle 510 to be exhausted through the exhaust hole 102. The flow of the process gas may be controlled according to the shape of the baffle 510 and the shape of the through-holes 511.

The plasma generating unit 600 may excite a process gas in the chamber 620 into a plasma state. According to an embodiment of the inventive concept, the plasma generating unit 600 may be a type of an inductively coupled plasma (ICP) type. In this case, as illustrated in FIG. 1, the plasma generating unit 600 may include a high frequency power supply 610 configured to supply high frequency power, and a first coil 621 and a second coil 622 electrically connected to the high frequency power supply 610 to receive high frequency power.

The first coil 621 and the second coil 622 may be disposed at locations that face the substrate W. For example, the first coil 621 and the second coil 622 may be installed above the chamber 620. The diameter of the first coil 621 may be smaller than the diameter of the second coil 622 such that the first coil 621 is situated inside the upper side of the chamber 620 and the second coil 622 is situated outside the upper side of the chamber 620. The first coil 621 and the second coil 622 may receive high frequency power from the high frequency power supply 610 to induce a time-variable magnetic field in the chamber, and accordingly, the process gas supplied to the chamber may be excited by plasma.

Hereinafter, a process of treating a substrate by using the above-described substrate treating apparatus will be described.

If the substrate W is positioned on the substrate support assembly 200, a direct current may be applied from the first power supply 223a to the first electrode 223. An electrostatic force may be applied between the first electrode 223 and the substrate W by a direct current applied to the first electrode 223, and the substrate W may be suctioned to the electrostatic chuck 210 by an electrostatic force.

If the substrate W is suctioned by the electrostatic chuck 210, the process gas may be supplied into the interior of the chamber 620 through the gas supply nozzle 410. The process gas may be uniformly ejected to an inner area of the chamber 620 through the ejection holes 311 of the shower head 300. The high frequency power generated by the high frequency power supply may be applied to a plasma source, and accordingly, an electromagnetic force may be generated in the chamber 620. The electromagnetic force may excite the process gas between the substrate support assembly 200 and the shower head 300 by using plasma. The plasma is provided to the substrate W to treat the substrate W. The plasma may perform an etching process.

According to an example of the inventive concept, an induced plasma reactor may obtain an anisotropic etching effect through a high ion energy impact by using a dual frequency bias electrode. According to an example, when the dual frequency bias electrode, that is, a low frequency (2 MHz) and a high frequency (13.56 MHz) are used for biasing of an electrode of a heater of the electrostatic chuck 210 and a multi-zone structure, the footprint of a filter box increases, and filtering may be influenced by high RF power and an increase in the high temperature of a ferrite core of a temperature filter of a chamber wall. The bias electrode may be included in the electrostatic chuck 210, and may be connected to a plurality of RF power supplies through an impedance matching circuit. The plurality of RF power supplies may apply the RF signals having different frequencies to the bias electrode through the impedance matching circuit.

As an example, when high RF power is applied by using the dual frequency bias electrode, the size of the filter increases, and when the electrostatic chuck 210 includes a plurality of heating zones, more filters are required.

The inventive concept aims at solving the above problems through a substrate temperature control unit 700. In more detail, in order to decrease the magnitude of an inductance, the temperature of the substrate may be controlled through a structure, in which a plurality of windings are wound on one ferrite core 700.

Figure 2:
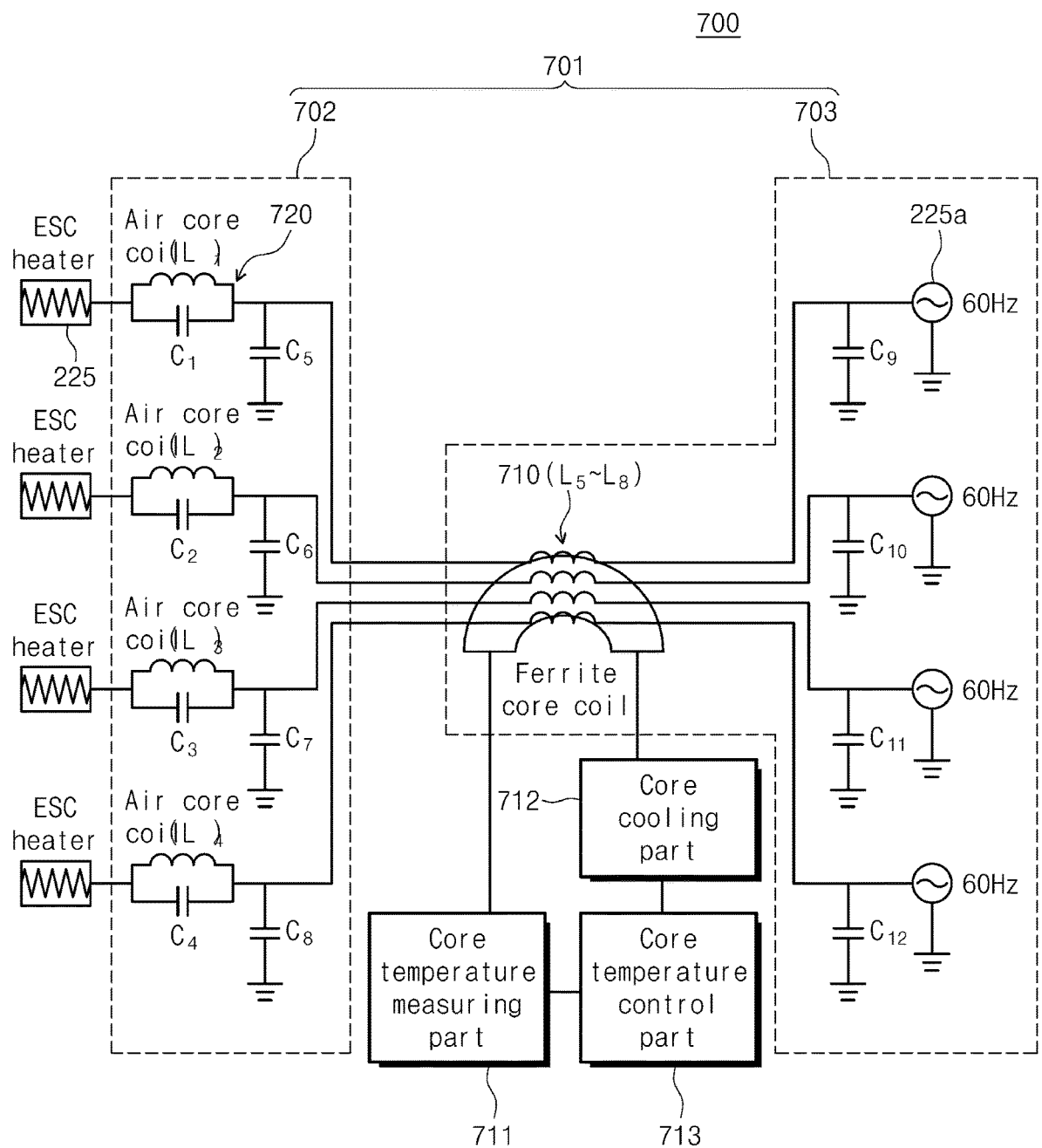
FIG. 2 is a circuit diagram illustrating a substrate temperature control unit according to an embodiment of the inventive concept.

FIG. 2 is a circuit diagram illustrating the substrate temperature control unit 700 according to an embodiment of the inventive concept.

Referring to FIG. 2, the substrate temperature control unit 700 may include a plurality of heaters 225, a power supply part 225a, and a filter circuit 701 including a first filter 702 and a second filter 703. The filter circuit 701 may include a ferrite core 710 and a plurality of air cores 720. The plurality of power supply parts 225a may be provided. The filter circuit 701 may be connected between the plurality of heaters 225 and the plurality of power supply parts 225. The first filter 702 may include the plurality of air cores 720, a plurality of capacitors C1 to C4 connected to the plurality of air cores 720 in parallel, respectively, and a plurality of capacitors C5 to C8 connected between the plurality of air cores 720 and the ground, respectively. A plurality of inductors L1 to L4 may include the plurality of air cores 720. For example, the first filter 702 may interrupt a high-frequency signal by performing filtering. The second filter 703 may include a plurality of inductors L5 to L8 connected to the plurality of inductors L1 to L4, respectively, and a plurality of capacitors C9 to C12 connected between the plurality of inductors L5 to L8 and the ground. The plurality of inductors L5 to L8 may be provided to one ferrite core 710. The second filter 703 may interrupt a low-frequency signal by performing filtering. The ferrite core 710 included in second filter 703 may interrupt a low-frequency signal. The filter circuit 701 may interrupt a plurality of RF powers applied to the bias electrode of the electrostatic chuck 210 from being introduced into the plurality of power supply parts 225*a*.

In the substrate temperature control unit 700, only one ferrite core 710 may be provided to be connected to the plurality of air cores 720. Furthermore, the ferrite core 710 may be provided between the plurality of air cores 720 and the power supply parts 225*a*, and the length of the ferrite core 710 may be larger than the length of the plurality of air cores 720. The ferrite core 710 may include a hollow cylindrical core and a coil that surrounds the core spirally. The coil of the ferrite core 710 may have an inductance of 100 μH to 150 μH.

Furthermore, the substrate temperature control unit 700 may include a ferrite core temperature measuring part 711 that measures the temperature of the ferrite core 710, a ferrite core cooling part 712 that is installed around the ferrite core 710 and cools the ferrite core 710, and a ferrite core temperature control part 713 that controls the ferrite core cooling part 712 according to the temperature of the ferrite core 710. According to an embodiment, the ferrite core temperature measuring part 711 may include an infrared (IR) temperature sensor. The ferrite core cooling part 712 may include a plurality of cooling fans installed on or under the ferrite core 710. However, the inventive concept is not limited thereto, and the ferrite core cooling part 712 may be implemented by various cooling devices that may cool the ferrite core 710. As an example, the ferrite core temperature control part 713 may control the ferrite core cooling part 712 such that the temperature of the ferrite core 710 measured by the ferrite core temperature measuring part 711 is maintained in a range of 50 degrees Celsius to 100 degrees Celsius. In detail, the ferrite core temperature control part 713 may increase the rotational speed of the plurality of cooling fans or operate a larger number of cooling fans, among the plurality of cooling fans, as the temperature of the ferrite core 710 measured by the ferrite core temperature measuring part 711 increases.

Figure 3A:
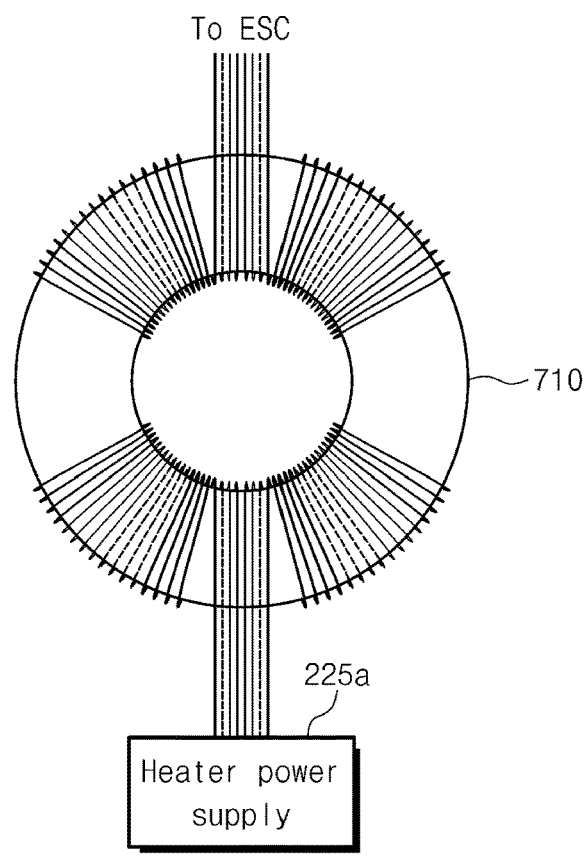
FIGS. 3A and 3B are views illustrating a ferrite core according to an embodiment of the inventive concept.
Figure 3B:
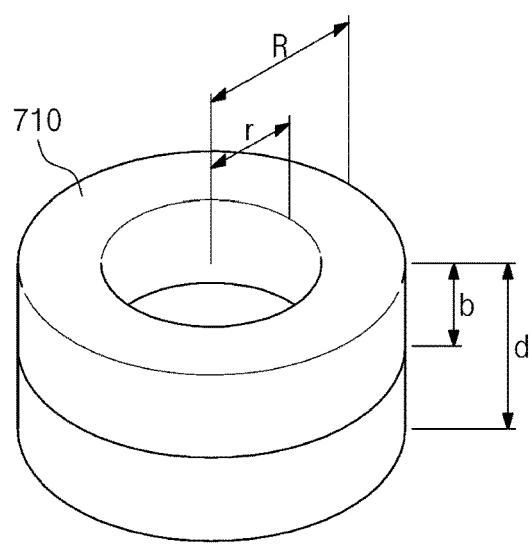

FIGS. 3A and 3B are views illustrating a ferrite core according to an embodiment of the inventive concept.

According to FIG. 3A, a view of a ferrite core according to an embodiment of the inventive concept, which is viewed from the top, is disclosed. According to FIG. 3B, a perspective view of a ferrite core according to an embodiment of the inventive concept is disclosed.

An inductance of the ferrite core 710 according to the inventive concept may be processed in the following equation.

$$L_2 = N^2 \times \mu \times d \times \frac{\ln\left(\frac{R}{r}\right)}{2\pi}$$

Then, N denotes the number of windings, μ denotes a magnetic permeability, r denotes the inner radius of the ferrite core, R denotes the outer radius of the ferrite core, and d denotes the height of the ferrite core.

According to FIG. 3 and the equation, due to the number of windings and the height of the ferrite core according to the embodiment of the inventive concept, a preferable filtering effect and an effect of achieving a chamber bottom impedance may be achieved.

The principle of the windings illustrated in FIG. 3 provides a possibility of adjusting the bias impedance of the chamber measured by using a VNA. For adjusting the impedance, a decreased resistance of the bias chamber impedance may be required.

Figure 4:
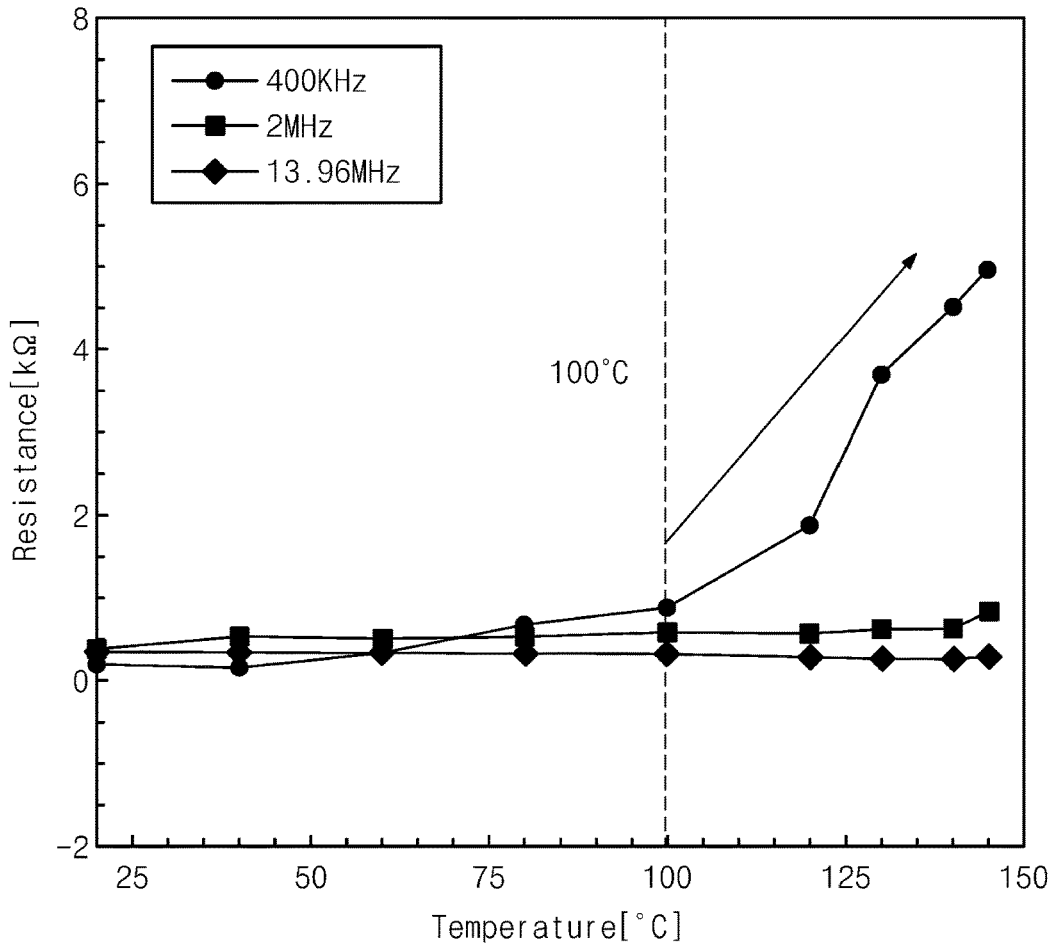
FIG. 4 is a view illustrating a change in a resistance value of a ferrite core according to a change in a temperature of the ferrite core according to an embodiment of the inventive concept.

Referring to FIG. 4, because the resistance value of the ferrite core 710 that interrupts a low-frequency signal abruptly increases and influences the process if the temperature of the ferrite core 710 increases to a specific temperature (for example, 100 degrees Celsius) or more, the inventive concept may monitor the temperature of the ferrite core 710 in real time, and may control such that the temperature of the ferrite core 710 is maintained in a specific range so that the resistance value of the ferrite core 710 may be constantly maintained. Accordingly, an influence on the process by the substrate temperature control unit 700 that controls the temperature of the substrate may be minimized.

Figure 5:
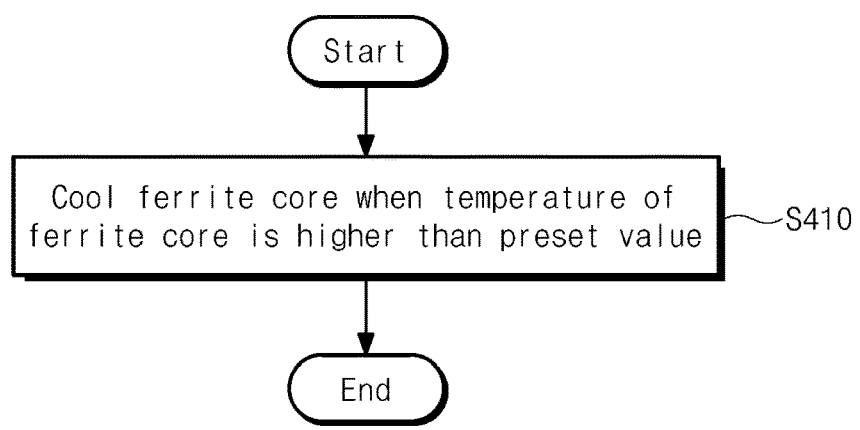
FIG. 5 is a flowchart illustrating a ferrite core temperature controlling method according to an embodiment of the inventive concept.

FIG. 5 is a flowchart illustrating a ferrite core temperature controlling method according to an embodiment of the inventive concept.

Referring to FIG. 5, when the temperature of the ferrite core is a preset value or more, the ferrite core is cooled (S410). For example, the preset value may be 100 degrees Celsius, but the inventive concept is not limited thereto. Furthermore, the ferrite core may be cooled such that the temperature of the ferrite core is maintained in a preset range.

According to various embodiments of the inventive concept, which has been described above, the resistance value of the ferrite core may be prevented from changing, and a stable process environment may be provided.

The method for controlling a temperature of a ferrite core may be implemented by a program that may be executed by a computer to be executed in a form of an application, and may be stored in a computer readable recording medium.

The computer readable recording medium may be a volatile memory such as a static RAM (SRAM), a dynamic RAM (DRAM), a synchronous DRAM (SDRAM), a non-volatile memory such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), a floppy disk, a hard disk, or an optical reading medium, for example, a storage medium such as a CD ROM or a DVD, but the inventive concept is not limited thereto.

According to various embodiments of the inventive concept, an influence of the filter on the process may be reduced, and the size of the filter may be reduced.

The effects of the inventive concept are not limited to the above-mentioned effects, and the unmentioned effects can be clearly understood by those skilled in the art to which the inventive concept pertains from the specification and the accompanying drawings.

It is noted that the above embodiments are suggested for understanding of the inventive concept and do not limit the scope of the inventive concept, and various modifiable embodiments also fall within the scope of the inventive concept. For example, the elements illustrated in the embodiments of the inventive concept may be individually implemented, and some of the individual elements may be coupled to each other to be implemented. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. A substrate treating apparatus comprising:
a chamber having a space for treating a substrate in an interior thereof;
a substrate support assembly including a support plate situated in the chamber and configured to support the substrate;
a gas supply unit configured to supply a gas into the interior of the chamber;
a plasma generating unit configured to excite the gas in in the interior of the chamber into a plasma state; and
a substrate temperature control unit configured to control a temperature of the substrate,
wherein the substrate temperature control unit includes:
a plurality of heaters installed in different areas of the support plate;
a power supply part configured to supply electric power to the plurality of heaters;
a ferrite core configured to interrupt a low-frequency signal introduced to the power supply part; and
a plurality of air cores configured to interrupt a high-frequency signal introduced into the power supply part.

2. The substrate treating apparatus of claim 1, wherein the ferrite core is provided between the plurality of air cores and the power supply part and a length of the ferrite core is larger than those of the plurality of air cores.

3. The substrate treating apparatus of claim 2, wherein one ferrite core is provided.

4. The substrate treating apparatus of claim 1, wherein the ferrite core comprises a coil having an inductance of 100 μH to 150 μH.

5. The substrate treating apparatus of claim 1, wherein the substrate temperature control unit further includes:
a ferrite core temperature measuring part configured to measure a temperature of the ferrite core.

6. The substrate treating apparatus of claim 5, wherein the substrate temperature control unit further includes:
a ferrite core cooling part configured to cool the ferrite core; and
a ferrite core temperature control part configured to control the ferrite core cooling part according to the temperature of the ferrite core.

7. The substrate treating apparatus of claim 6, wherein the ferrite core cooling part includes a plurality of cooling fans installed around the ferrite core.

8. The substrate treating apparatus of claim 6, wherein the ferrite core temperature control part controls the ferrite core cooling part such that the temperature of the ferrite core is maintained in a range of 50 to 100 degrees Celsius.

9. A substrate treating apparatus comprising:
a chamber having a space for treating a substrate in an interior thereof;
a substrate support assembly including a support plate situated in the chamber and configured to support the substrate;
a gas supply unit configured to supply a gas into the interior of the chamber;
a plasma generating unit configured to excite the gas in in the interior of the chamber into a plasma state; and
a substrate temperature control unit configured to control a temperature of the substrate,
wherein the substrate temperature control unit includes:
a plurality of heaters installed in different areas of the support plate;
a plurality of power supply parts configured to supply electric power to the plurality of heaters, respectively; and
a filter circuit connected between the plurality of heaters and the plurality of power supply parts, and
wherein the filter circuit includes:
a first filter configured to perform filtering by using a plurality of air cores connected to the plurality of heaters, respectively; and
a second filter connected between the first filter and the plurality of power supply parts and configured to perform filtering by using one ferrite core.

10. The substrate treating apparatus of claim 9, wherein the first filter interrupts a high-frequency signal introduced into the power supply part, and
wherein the second filter interrupts a low-frequency signal introduced into the power supply part.

11. The substrate treating apparatus of claim 9, wherein the ferrite core is provided between the plurality of air cores and the power supply part and a length of the ferrite core is larger than those of the plurality of air cores.

12. The substrate treating apparatus of claim 11, wherein one ferrite core is provided.

13. The substrate treating apparatus of claim 9, wherein the substrate temperature control unit further includes:
a ferrite core temperature measuring part configured to measure a temperature of the ferrite core.

14. The substrate treating apparatus of claim 13, wherein the substrate temperature control unit further includes:
a ferrite core cooling part configured to cool the ferrite core; and
a ferrite core temperature control part configured to control the ferrite core cooling part according to the temperature of the ferrite core.

15. The substrate treating apparatus of claim 14, wherein the ferrite core cooling part includes a plurality of cooling fans installed around the ferrite core.

16. The substrate treating apparatus of claim 14, wherein the ferrite core temperature control part controls the ferrite core cooling part such that the temperature of the ferrite core is maintained in a range of 50 to 100 degrees Celsius.

* * * * *